United States Patent

Shou et al.

[11] Patent Number: 5,917,343
[45] Date of Patent: Jun. 29, 1999

[54] MOS INVERTER CIRCUIT

[75] Inventors: Guoliang Shou; Kazunori Motohashi; Makoto Yamamoto; Sunao Takatori, all of Tokyo, Japan

[73] Assignees: Yozan, Inc., Tokyo; Sharp Kabushiki Kaisha, Osaka, both of Japan

[21] Appl. No.: 08/922,680

[22] Filed: Sep. 3, 1997

Related U.S. Application Data

[63] Continuation of application No. 08/536,327, Sep. 29, 1995, abandoned.

[30] Foreign Application Priority Data

Sep. 30, 1994 [JP] Japan ................................. 6-261627
Oct. 24, 1994 [JP] Japan ................................. 6-284496
Nov. 16, 1994 [JP] Japan ................................. 6-306925
Aug. 9, 1995 [JP] Japan ................................. 7-224611

[51] Int. Cl.$^6$ ....................... H03K 19/0948; H01L 27/00
[52] U.S. Cl. ................. 326/103; 326/34; 326/83
[58] Field of Search .................... 326/101–103, 326/83, 121, 21, 31, 34

[56] References Cited

U.S. PATENT DOCUMENTS

| | | | |
|---|---|---|---|
| 4,503,342 | 3/1985 | Adam | 326/103 |
| 4,961,012 | 10/1990 | Nishitani | 326/103 |
| 5,132,563 | 7/1992 | Fujii et al. | 326/103 |
| 5,306,967 | 4/1994 | Dow | 326/101 |
| 5,420,806 | 5/1995 | Shou et al. | 364/606 |

FOREIGN PATENT DOCUMENTS 6-215164  8/1994  Japan .

Primary Examiner—Jon Santamauro
Attorney, Agent, or Firm—Pillsbury Madison & Sutro, LLP

[57] ABSTRACT

A MOS inverter within a large scale integrated circuit (LSI) includes a pair of circuits with the same performance. Each of the circuits includes a plurality of MOS inverters serially connected from the first stage to the last stage. Each of the MOS inverters is provided with an input such that the input of the MOS inverters of the first stage are formed to be adjacent one another.

1 Claim, 9 Drawing Sheets

MOS INVERTER CIRCUIT

This is a continuation of application Ser. No. 08/536,327, filed on Sep. 29, 1995, which was abandoned upon the filing hereof.

FIELD OF THE INVENTION

The present invention relates to a MOS inverter, especially to a MOS inverter circuit comprising a plurality of MOS inverters with the same characteristics serially connected, for example, when a plurality of inverted amplifiers are formed in a large scale integrated circuit (LSI).

BACKGROUND OF THE INVENTION

The inventors of the present invention have proposed a circuit including an inverted amplifier of MOS inverter in Japanese Patent Application Hei 05-020676 and U.S. patent application Ser. No. 08/181,118, filed Jan. 13, 1994, now U.S. Pat. No. 5,420,806. The circuit has a capacitive coupling for multiplying an analog voltage by a digital multiplier by each capacitance of the capacitive coupling. The capacitive coupling outputs an analog voltage to two stages of sequential inverted amplifiers INVI1 and INV2, or to inverted amplifiers INV3 and INV2 so that the output is stable and high in accuracy. Each inverted amplifier is composed of sequential MOS inverters of 3 stages an output of which is connected through a feedback capacitance to its input. The inverted amplifier keeps stability and linearity of the output by its large open gain as a multiplication of gains of three MOS inverters. However, MOS inverters have some dispersions in the offset voltages, which increase as the distance between MOS inverters extends within the LSI. The offset dispersion influences the output accuracy; the first stage inverter among the three stages has an especially large influence on the output.

SUMMARY OF THE INVENTION

The present invention is invented so as to solve the conventional problems and provides a MOS inverter to control the dispersion of offset voltage of MOS inverters to be minimum.

According to the present invention, the first stage MOS inverters of two inverted amplifiers are formed adjacent so as to face each other at their input sides.

DETAILED DESCRIPTION OF THE PRESENTLY PREFERRED EXEMPLARY EMBODIMENTS

An embodiment of a MOS inverter according to the present invention will now be described with reference to the attached drawings.

Figure 1:
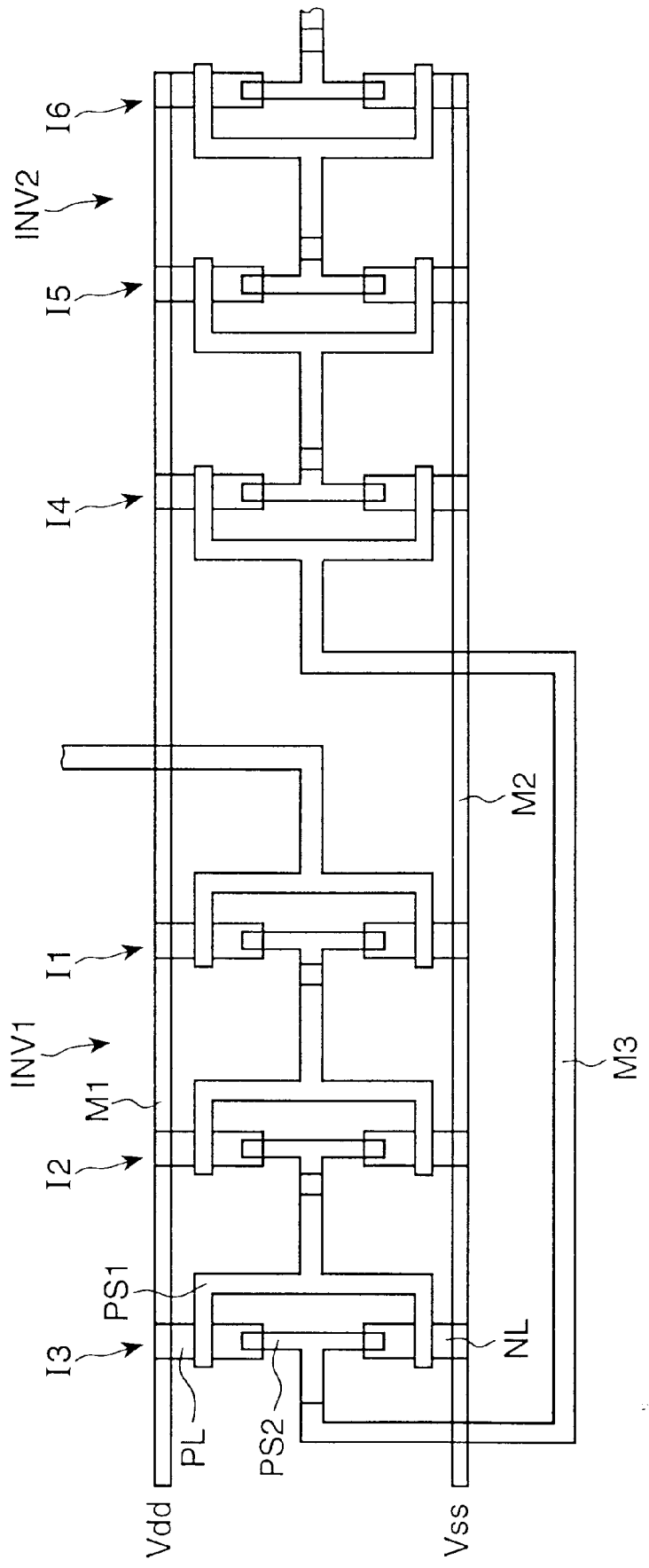
FIG. 1 is a plan view showing the first embodiment of a MOS inverter according to the present invention.
Figure 2:
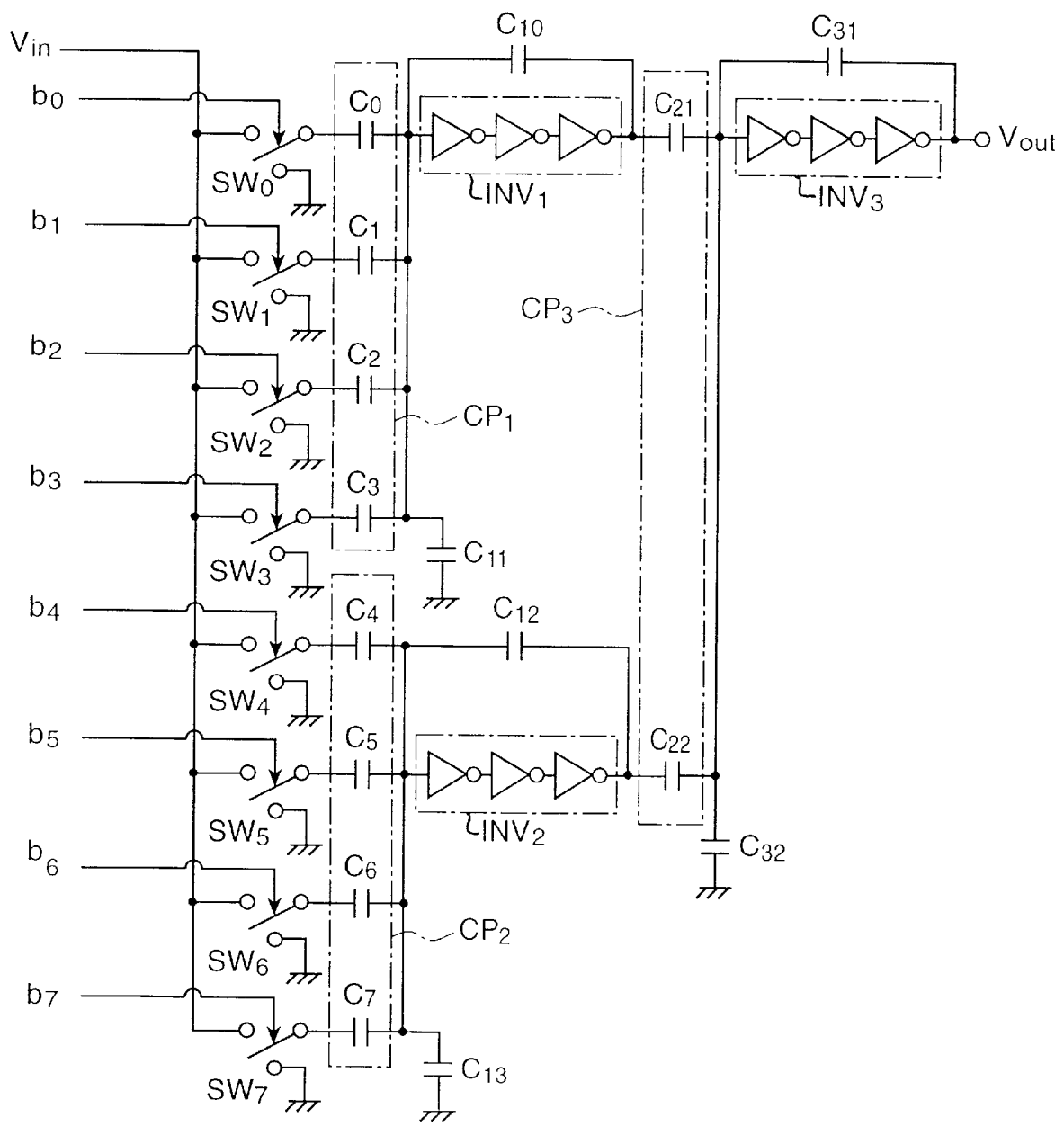
FIG. 2 is a circuit diagram showing the circuitry embodiment suitable for the present invention.

FIG. 1 shows a LSI pattern of two inverted amplifiers having three MOS inverters serially connected. The first inverted amplifier INV1 includes inverters I1, I2 and I3, and the second inverted amplifier INV2 includes inverters I4, I5 and I6.

For each of inverters I1, I2, I3, I4, I5 and I6, there are shaped areas PL and NL made a p-layer and an n-layer, respectively, and input and output lines PS1 and PS2 made of poly-silicon. The voltage Vdd and Vss of the power source and the ground are connected through metal lines M1 and M2 to the areas PL and NL, respectively.

In FIG. 1, I1, I2 and I3 are arranged from the right to the left, and I4, I5 and I6 are arranged from the left to the right. The first stage inverter I1 and I4 are shaped at adjacent positions to each other. This positioning make the offset voltage of the inverters I1 and I4 substantially equal, because adjacent inverters generally have similar characteristics.

In order to realize the adjacent positioning, an output of the inverter I3 is introduced through a metal line M3 to a position rightward from I1, and is connected to I4.

As mentioned above, dispersion of characteristics of the inverted amplifiers is controlled to be minimum, and the accuracy is improved.

The present invention can be applied not only to the above inverted amplifier but to any circuit including a plurality of MOS inverters serially connecting with the same characteristics.

Hereinafter, the second embodiment of a MOS inverter according to the present invention will be described with reference to the attached drawings.

Figure 3:
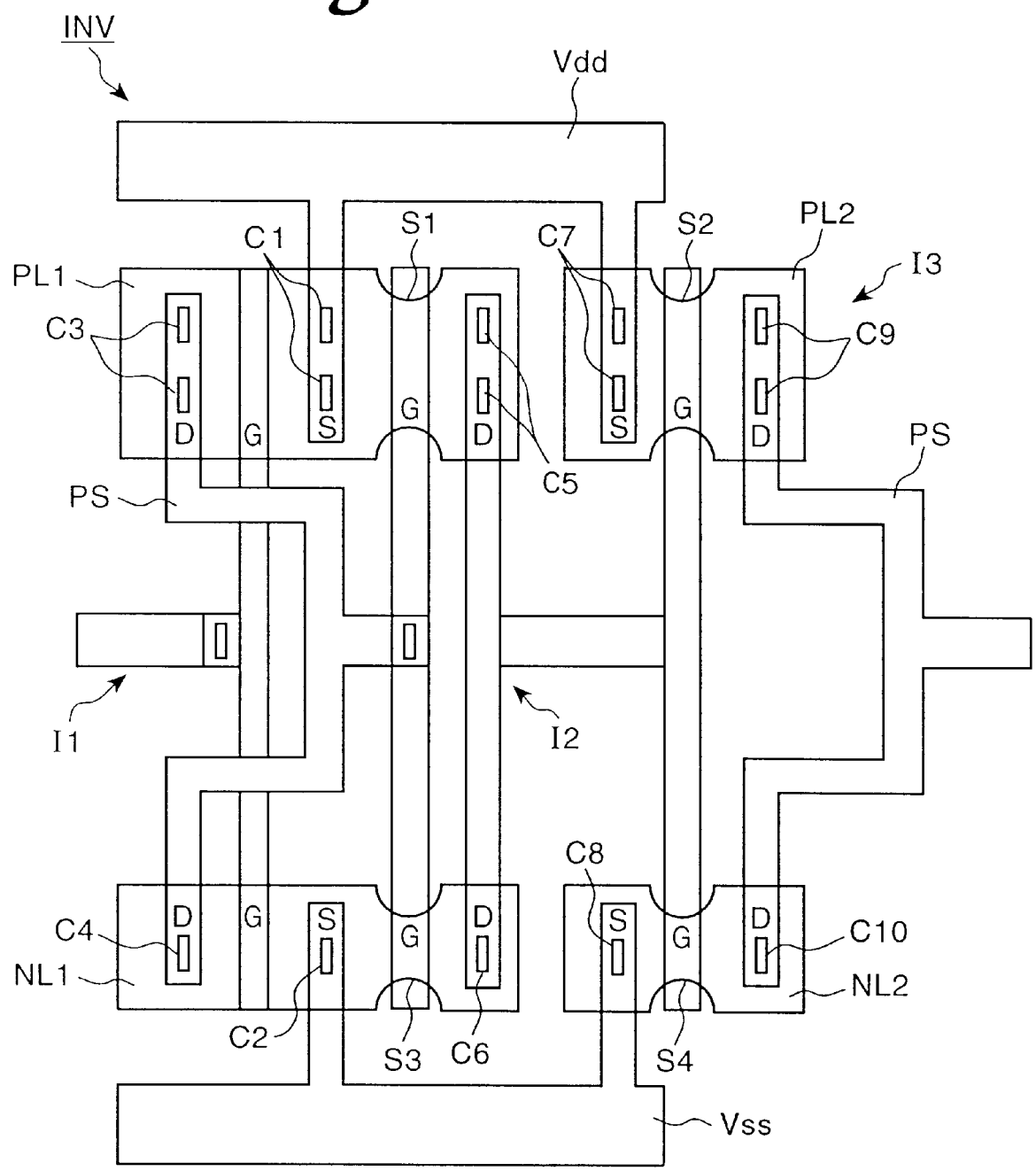
FIG. 3 is a plan view showing the second embodiment of a MOS inverter circuit.

FIG. 3 shows LSI pattern of an inverted amplifier INV including 3 stages of MOS inverts I1, I2 and I3. For the inverters I1 and I2, there are shaped a common P-type semiconductor layer PL1 and a common N-type semiconductor layer NL1. P-type semiconductor layer PL2 and N-type semiconductor layer NL2 are shaped for inverter I3. Drain voltage Vdd and source voltage Vss are connected to PL1 and NL1 through contacts C1 and C2. A contact is a metal part passing through in semiconductor layer in the direction of thickness, for electrical connection. The drain voltage Vdd and source voltage Vss are connected to PL2 and NL2 through contacts C7 and C8.

The semiconductor layers PL1 and NL1 are provided with contacts C3 and C4 for an output from the first stage, respectively, and are provided with contacts C5 and C6 for an output from the second stage, respectively. The semiconductor layers PL2 and NL2 are provided with contacts C9 and C10 for an output from the third stage, respectively, from which an output is introduced through a poly-silicon portion PS toward the next stage.

A strangulation portion S1 is provided between the contacts C1 and C5 in the semiconductor layer PL1, and a strangulation portion S3 is provided between the contacts C2 and C6 in the semiconductor layer NL1. A strangulation portion S2 is provided between contacts C7 and C9 in the semiconductor layers PL2, and a strangulation portion S4 is provided between contacts C8 and C10 in the semiconductor layer NL2.

These strangulation portions S1 and S3 limit an electric current of the output of inverter I2, and simultaneously decreases parasitic capacitance of a transistor included in the inverter I2 by decreasing electric current. A delay of performance of I2 due to the parasitic capacitance is diminished, so the responsivity is highly improved. Usually, the strangulation portion causes an instability of output due to strangulated-channel-effect and an increase of input side parasitic capacitance. However, these disadvantageous effect are not so influential in the second stage. The above advantageous effect is much more influential than the disadvantageous effects. On the other hand, the strangulation portions S2 and S4 limit an output electric current of the inverter I3 of the final stage, and it is possible to save electrical power. Also in this stage, there is a possibility of disadvantageous effect above. The size of the strangulation portion should be designed so that the advantages are superior to the disadvantages.

The present invention is not limited to the circuit of three stage MOS inverters, but can be adopted to a circuit including serially connected MOS inverters for which one common semiconductor layer with the same polarity is shaped..

Hereinafter, the third embodiment of a MOS inverter circuit according to the present invention will be described with reference to the attached drawings.

Figure 4:
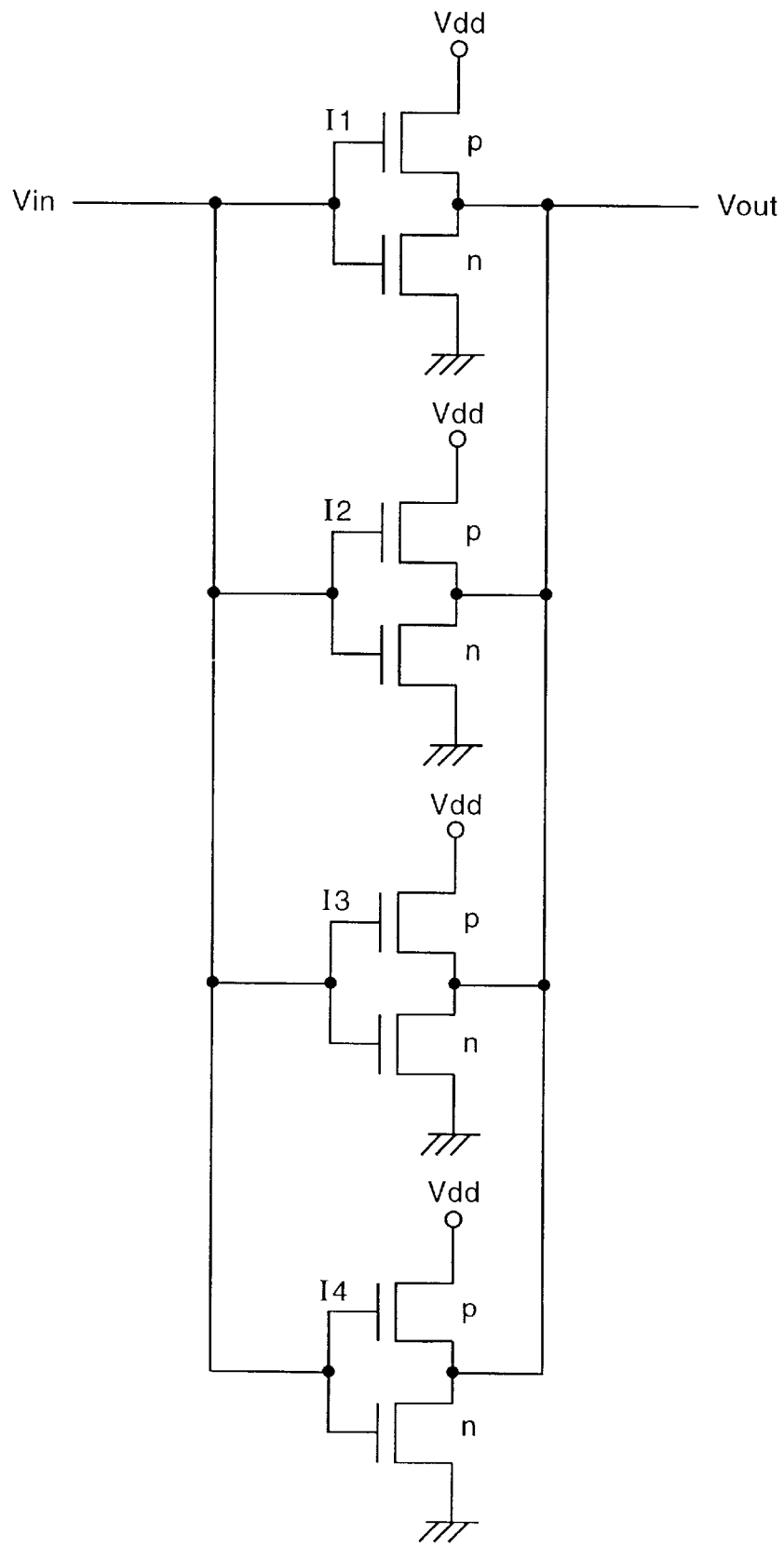
FIG. 4 is a circuit diagram showing a MOS inverter.

In FIG. 4, a MOS inverter circuit has a plurality of MOS inverters I1 to I4 connected in parallel at their inputs and outputs, to which a single output voltage Vout is generated in response to a single input voltage Vin. Each MOS inverter is a CMOS inverter composed of pMOS type FET and nMOS type FET. A source of pMOS type FET is connected to a voltage Vdd of the power source. This parallel circuit has characteristics of an average characteristics of the total inverters, and dispersion of each element is compensated. Therefore, there is no problem of low accuracy due to dispersion of elements, so it is easy to produce a LSI of high accuracy. This causes improvement of yield and cost performance of manufacturing.

Here, when a threshold voltage of pMOS type FET is Vtp and threshold value of nMOS type FET is Vtn, then the threshold voltage Vin of a single inverter is given by the formula 1, Vin of N parallel inverters is given by the formula (2).

$$Vin = \frac{Vdd + Vtp + Vtn \cdot \sqrt{(\beta n / \beta p)}}{1 + \sqrt{(\beta n / \beta p)}} \qquad \text{Formula 1}$$

$$\sum_{i=1}^{N} \beta pi \cdot (Vin - Vdd - Vtpi)^2 = \sum_{i=1}^{N} \beta ni \cdot (Vin - Vtni)^2 \qquad \text{Formula 2}$$

$\beta p$ and $\beta n$ are coefficient shown by formulas 3 and 4. In the formulas, $\mu p$ and $\mu n$ are mobility of electron of pMOS type FET and nMOS type FET, $\epsilon$ and tox are dielectric constant and thickness of gate oxide layer per unit area, Wp and Wn are channel width, and Lp and Ln are channel lengths.

$$\beta p = \frac{\mu p \cdot \varepsilon}{tox} \cdot \frac{Wp}{Lp} \qquad \text{Formula 3}$$

$$\beta n = \frac{\mu n \cdot \varepsilon}{tox} \cdot \frac{Wn}{Ln} \qquad \text{Formula 4}$$

Dispersion of threshold value appears as a normal distribution in response to a value of $\beta$, however, formula 2 can not be analytically solved because it involves $\beta$ of two terms. It is well known that a bi-polar transistor is improved in the quality by parallel connecting. Therefore, electrical elements connected in parallel have stable characteristics due to averaged characteristics of each element because the characteristics of the elements are statistically averaged.

This expectation is proved by an experiment. According to a simulation experiment, dispersion V1(Vin) of threshold voltage Vin shown by formula 1 is larger than a dispersion V2(Vin) of threshold voltage Vin shown by formula 2.

Figure 5:
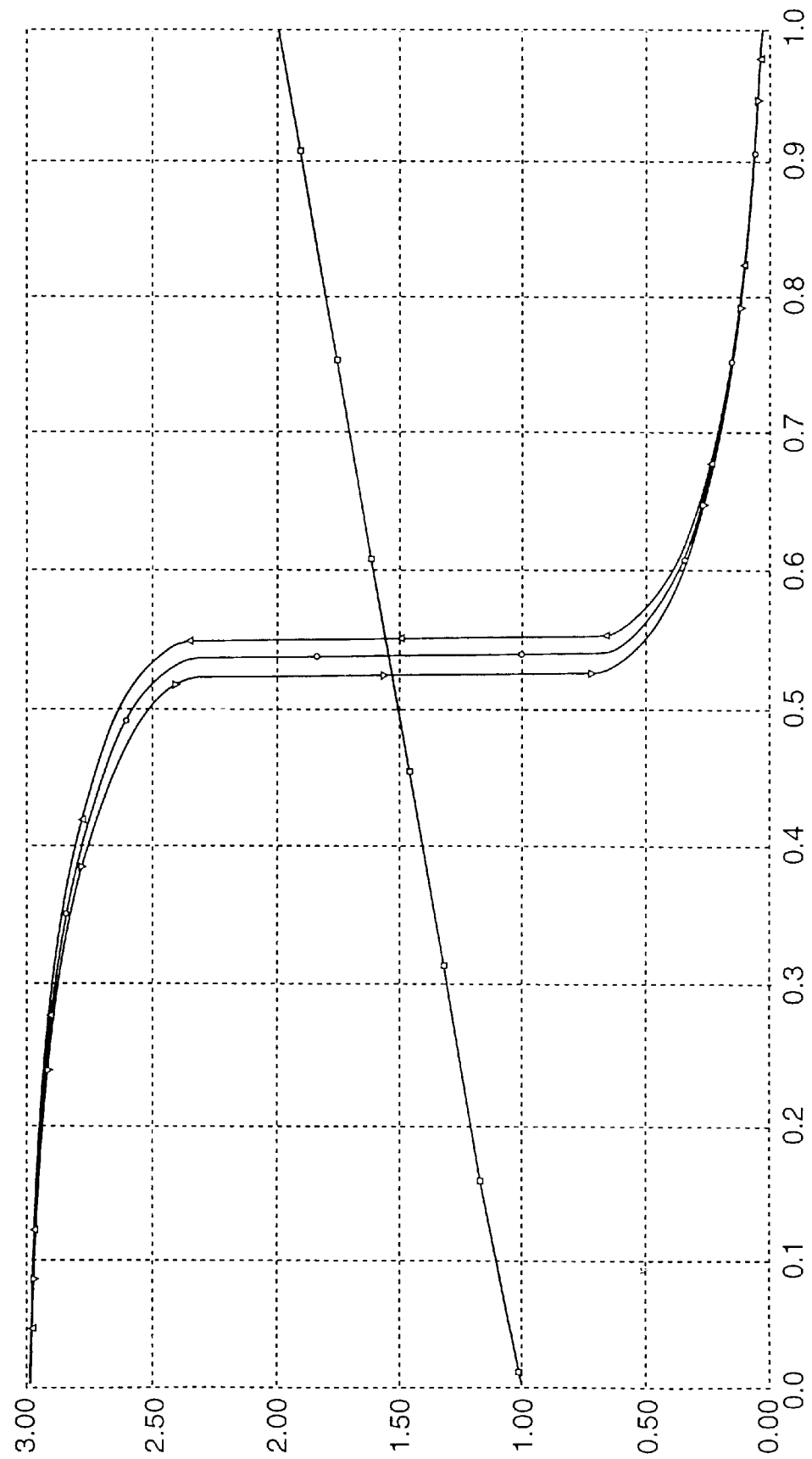
FIG. 5 is a graph showing characteristics of a plurality of MOS inverters connected in parallel.

FIG. 5 is a graph showing voltage characteristic in a case that 2 inverters are connected in parallel. □-□ shows a voltage Vin impressed to an input terminal, Δ-Δ and ∇-∇ show characteristics of a single inverter and ○-○ shows characteristics of two inverters connected in parallel.

It will be understood from FIG. 5 that an average characteristics of characteristics of total inverters is obtained. It also valid when the number of inverters are over three. By connecting a plurality of inverters in parallel, the accuracy of the threshold value can be statistically improved over when only a single inverter is used.

Figure 6:
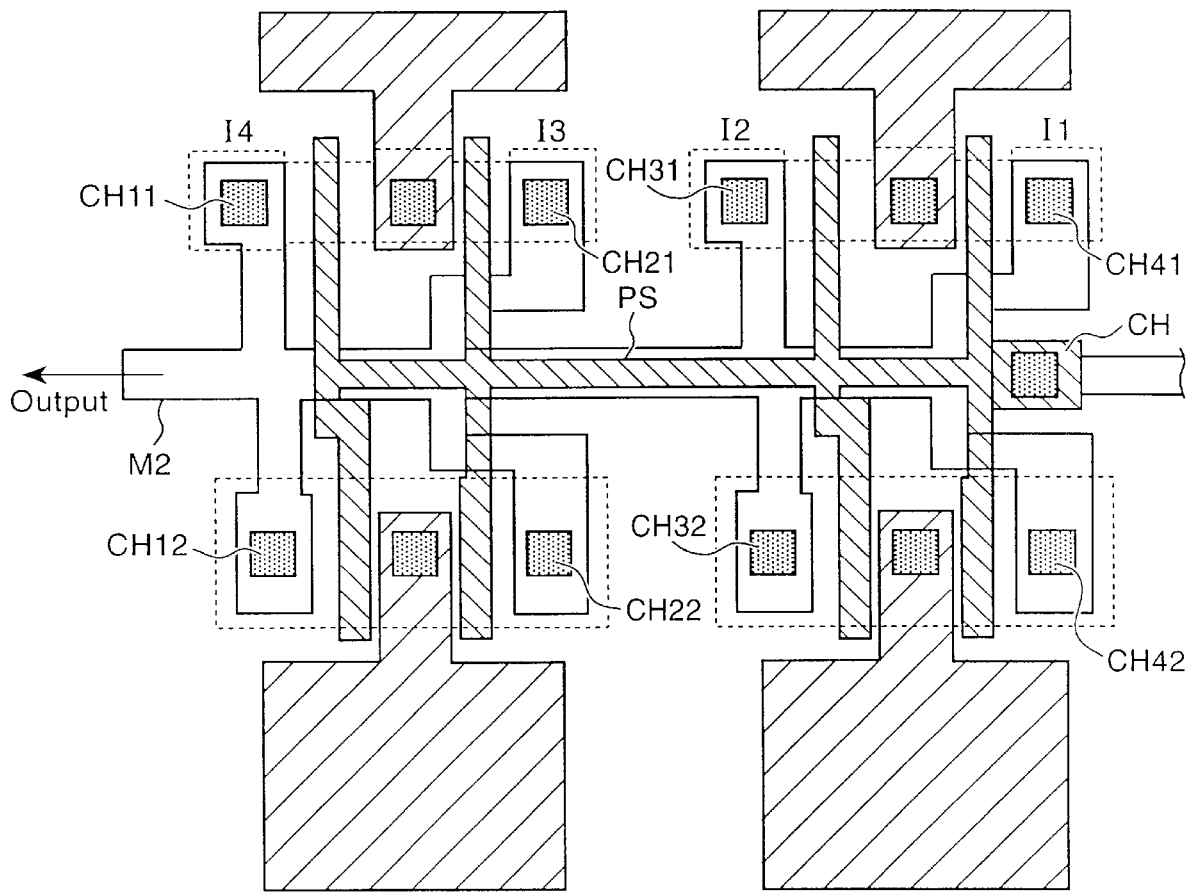
FIG. 6 is a plan view showing the third embodiment of LSI pattern.

FIG. 6 shows a pattern in LSI of a MOS inverter circuit. Usually, input and output of each MOS inverter are wired in a different layer, called input/output layer, from a layer, called semiconductor layer, where the P-layer and N-layer of the MOS are formed. The input and output are introduced through contact holes to the semiconductor layer. In a pattern of FIG. 6, only one contact hole CH is commonly provided on the input side for four MOS inverters I1 to I4. Input voltage is led to a gate of each MOS inverter from the contact hole CH through a poly-silicon PS.

On the output side of each of MOS inverters I1, I2, I3 and I4, there are provided two contact holes CH11 and CH12, CH21 and CH22, CH31 and CH32, CH41 and CH42, respectively. The outputs of pMOS and nMOS are led to the input/output layers from these contact holes. Outputs of each MOS inverter are connected to the circuit of the next stage through metallic wire M2.

Generally, a contact hole is formed in a square area which is wider than a width of the metallic wire. Where a plurality of contact holes are to be provided, it is necessary to provide intervals between the contact holes. Thus, the writing area is increased by such restrictions when contact holes are to be formed. The embodiment above is advantageous because many contact holes can be eliminated by using a common contact hole for input. As a result, wiring is simplified and wiring area is decreased.

Hereinafter, the fourth embodiment of an inverter circuit according to the present invention will be described with reference to the attached drawings.

Figure 7:
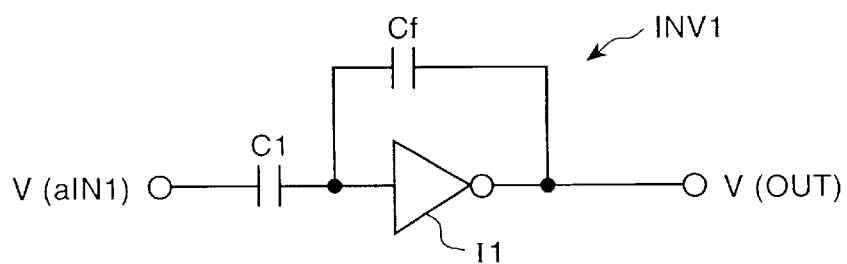
FIG. 7 is a circuit diagram showing the fourth embodiment.

FIG. 7 shows an inverter circuit INV1 for obtaining an inverted output V(OUT) with weight in response to an input voltage V(aIN1). The inverted circuit has one stage of MOS inverter I1, and its input is connected to the input voltage V(aIN1) through input capacitor C1, and its output is connected to its input through a feedback capacitor Cf.

Logical inverted output V' of input voltage V(aIN1) is defined in formula 5 when the power voltage is Vdd.

$$V'=Vdd-(C1/Cf)V(aIN1) \quad \text{Formula 5}$$

Figure 8:
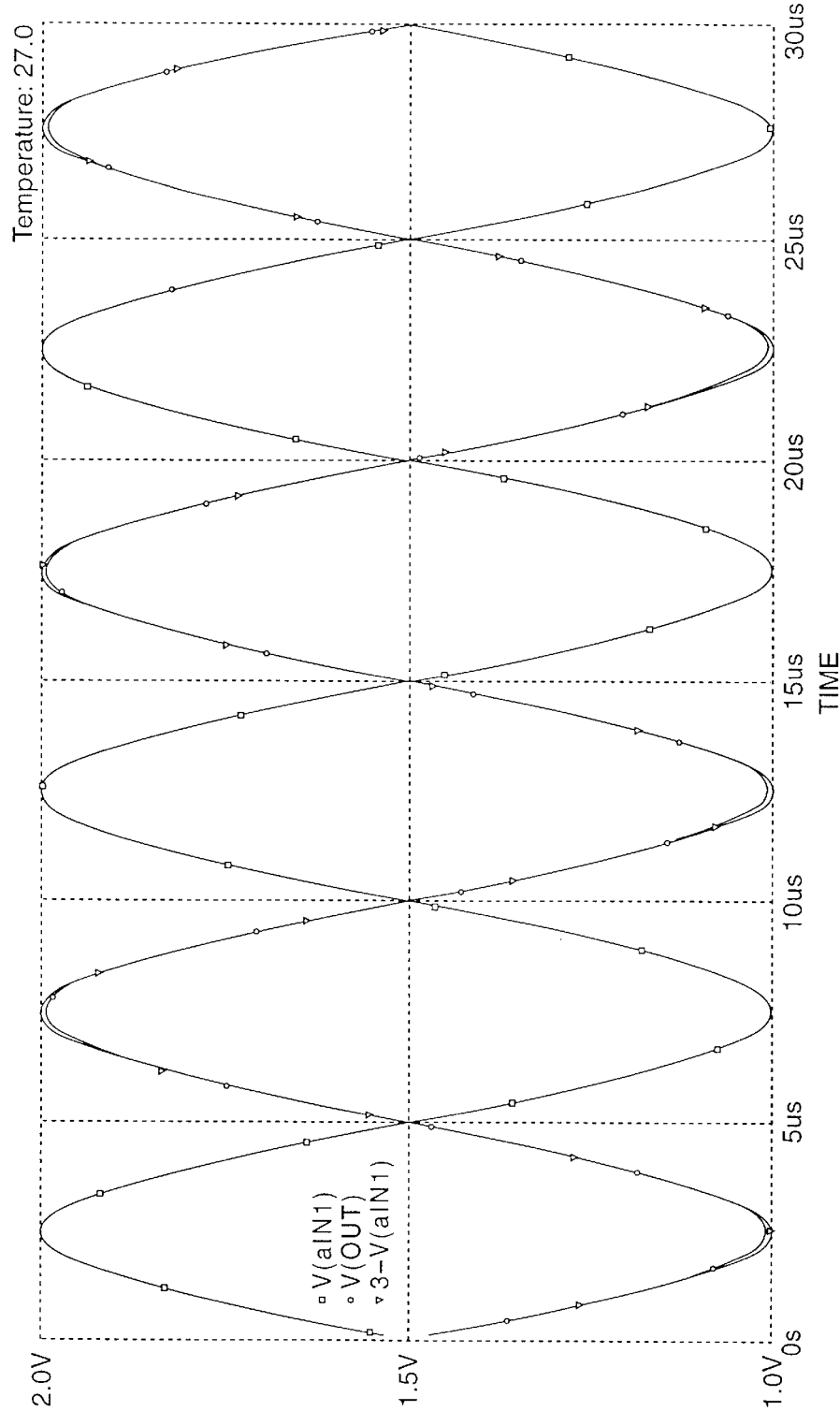
FIG. 8 is a graph showing a simulation result of the fourth embodiment.

FIG. 8 is a simulation result of V' and V(OUT) for their comparison by an analog circuit simulator Hspice.

In FIG. 8, V(aIN1), V(OUT) and V' are shown by "□", "○" and "▽", respectively. As shown in FIG. 8, when Vdd is equal to 3 [V], the following formula 6 is defined.

$$1[V] \leq (aIN1) \leq 2[V] \quad \text{Formula 6}$$

V(aIN1) is equal to or more than 1[V] and equal to or less than 2[V], then V(OUT) is good approximation of V'.

By an inversion with eight of MOS inverter of one stage, rather high accuracy can be obtained in an appropriate condition. Phase difference between input and output and consumed electricity is decreased because the MOS inverter has only one stage.

Figure 9:
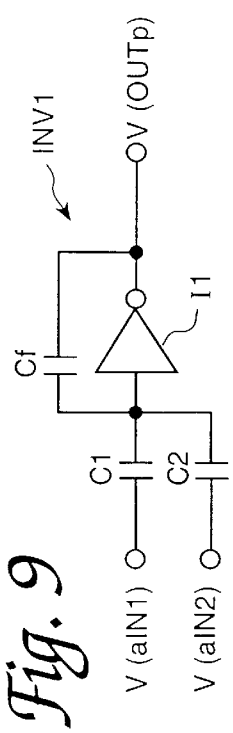
FIG. 9 is a circuit diagram showing the fifth embodiment.

Hereinafter, the fifth embodiment of the present invention will be described with reference to the attached drawings. FIG. 9 shows an inverter circuit INV1 for summation with weighting. This circuit includes capacitors C1 and C2 connected parallel to an input of a MOS inverter I1 of one stage. This embodiment is an embodiment similar to the fourth embodiment, but with the additional capacitor C2 connected in parallel with the capacitor C1. An inverted summation is generated of weighted input voltages input to the first and the second capacitors. An output of the MOS inverter I1 is connected through a feedback capacitor Cf to its input.

Input voltage (aIN1) and V(aIN2) are connected to input capacitor C1 and C2, and V(OUTp) is generated as an output voltage. A mathematically ideal value V' of inversion of weighted summation is defined in formula 7.

$$V'=Vdd-\{C1V(aIN1)+C2V(aIN2)\}/Cf \quad \text{Formula 7}$$

Figure 10:
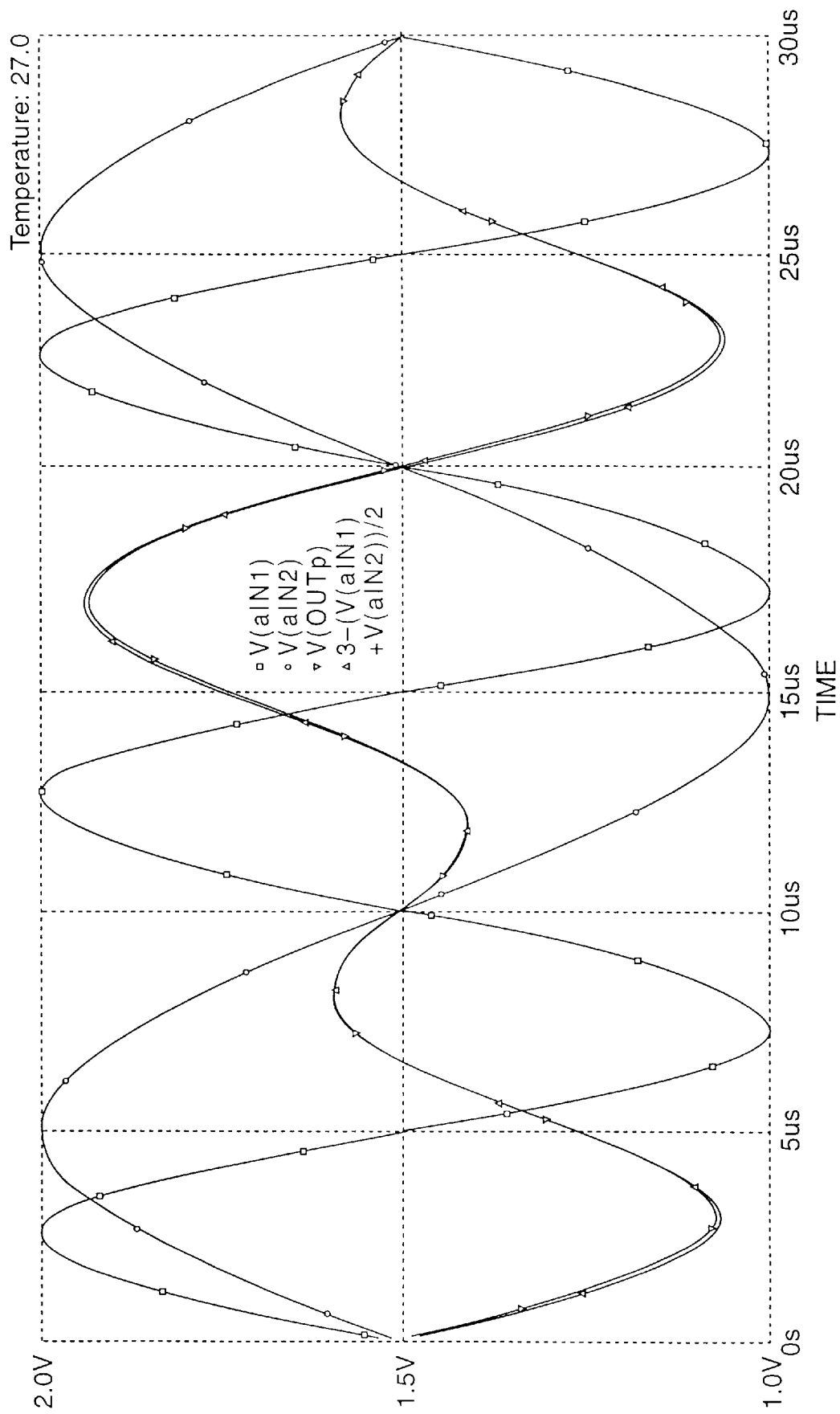
FIG. 10 is a graph showing a simulation result of the fifth embodiment.

FIG. 10 shows a practical output V(OUTp) simulated by Hspice, comparing with V'. In FIG. 10, V(aIN1), V(aIN2), V(OUTp) and V' are shown by "58", "◇", "▽", and "Δ", respectively. As will be understood from FIG. 10, when Vdd is equal to 3[V], V(OUT) is a good approximation of V(OUT) in the range of the following formulas 8 and 9.

$$1[V] \leq V[aIN1] \leq 2[V] \quad \text{Formula 8}$$

$$1[V] \leq V[aIN2] \leq 2[V] \quad \text{Formula 9}$$

As mentioned above, sufficiently high accuracy can be obtained by one stage MOS inverter.

Figure 11:
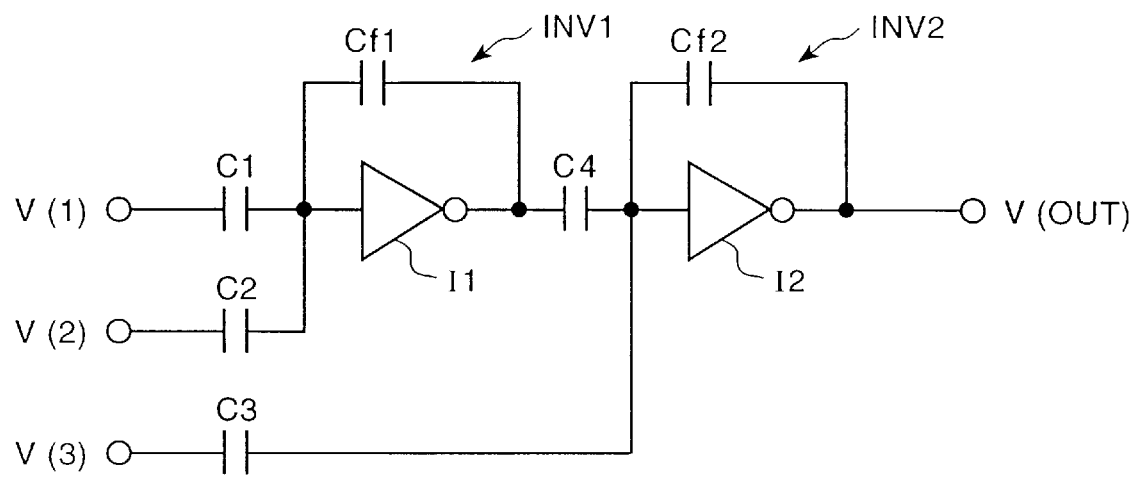
FIG. 11 is a circuit diagram showing the sixth embodiment.

FIG. 11 is a circuit of the sixth embodiment. An inverter circuit INV1 has MOS inverters I1 and I2 serially connected, each of which is one stage MOS inverter. Parallel input capacitors C1 and C2 are connected to an input of inverter I1. An output of the inverter I1 is connected to its input through a feedback a capacitor Cf1, and the output is connected to an input of the inverter I2 through connecting capacitor C4. An input capacitor C3 is further connected to the input of I2 in parallel with the capacitor C4. An output of inverter I2 is connected to the input through feedback capacitor Cf2. Input voltages V(1), V(2) and V(3) are connected to capacitors C1, C2 and C3.

Inverter circuit INV1 includes one stage MOS inverter I1, capacitors C1, C2 and Cf1, and inverter circuit INV2 consists of one stage MOS inverter I2, capacitors C4 and C3. The inverter circuit INV1 generates an inverted output of summation of weighted voltages of V(1) and V(2), on the other hand, inverter circuit INV2 generates an inverted output V(OUT) of weighted summation of an output from INV1 and the input V(3).

A mathematical output of inverted summation with weighting is shown by formula 10, as V'.

$$V' = \frac{C_1 C_4}{Cf_1 Cf_2}V(1) + \frac{C_2 C_4}{Cf_1 Cf_2}V(2) - \frac{C_3}{Cf_2}V(3) - \frac{C_1 C_4 + C_2 C_4 - C_1 C_3}{Cf_1 Cf_2}Vb \quad \text{Formula 10}$$

V(OUT) is a good approximation. A simulation result neglected.

Figure 12:
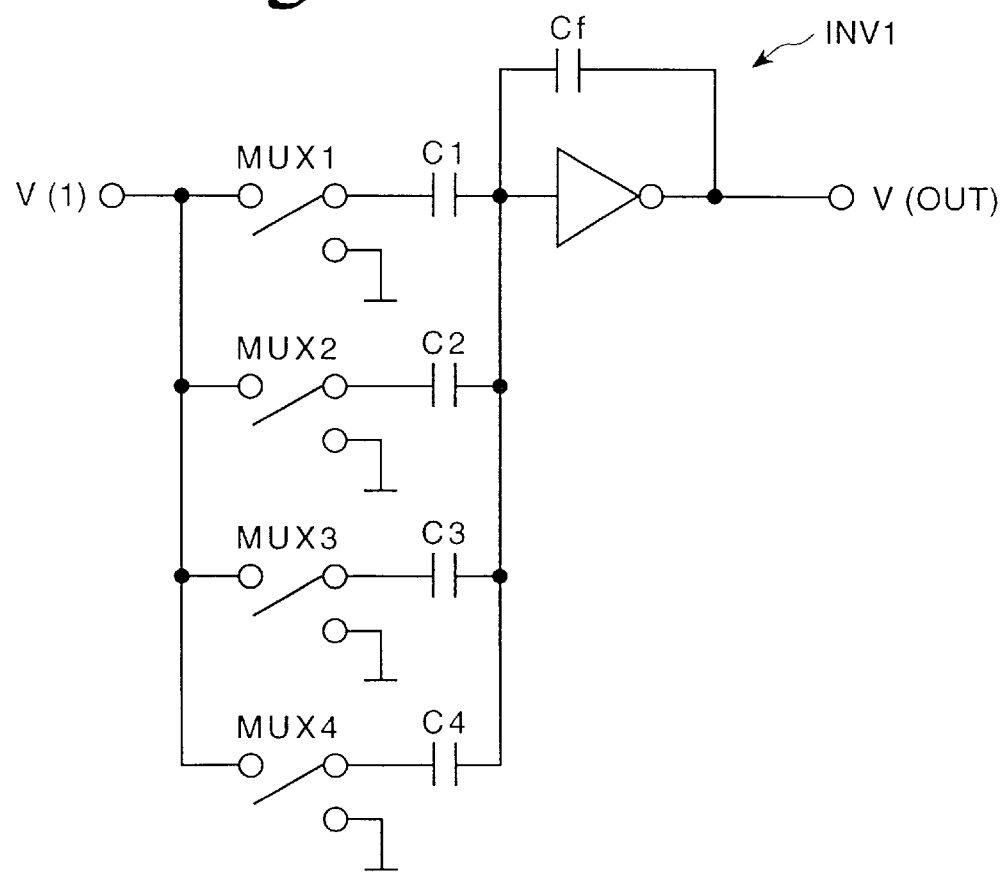
FIG. 12 is a circuit diagram showing the seventh embodiment.

FIG. 12 is a circuit diagram showing the eighth embodiment. A plurality of input capacitors C1 to C4 are connected in parallel to a MOS inverter I1 of one stage.

These capacitors are commonly connected to an input voltage V(1) through a multiplexers MUX1, MUX2, MUX3 and MUX4, respectively. The multiplexers connects the input voltage V(1) or the ground to the capacitors. An output of the inverter I1 is connected to its input through feedback capacitor Cf.

By switching the multiplexers MUX1, MUX2, MUX3 and MUX4, a weight for V(1) is controlled so that an effect of multiplication is obtained. The multiplication result is generated as an output V(OUT) from INV1. Capacitance ratio of C1, C2, C3 and C4 and Cf is defined as in formula 11.

$$C1:C2:C3:C4:Cf=1:2:4:8:16 \quad \text{Formula 11}$$

When switching positions of MUX1, MUX2, MUX3 and MUX4 are represented by b0, b1, b2 and b3, which correspond to 0/1 (0: ground side: V:V(1) side), A mathematically ideal output V' of the circuit is shown in formula 12.

$$V'=(b0C1+b1C2+b2C3+b3C4)V(1)/Cf \quad \text{Formula 12}$$

This is a normalized multiplication result of V(1) multiplied by a binary number including bits b0 to b3. Simulation result is omitted, but V(OUT) is a good approximation of V'.

What is claimed is:

1. A MOS inverter formed within a large scale integrated circuit, comprising:

a pair of circuits, each of said circuits comprising a plurality of serially connected MOS inverters;

wherein an input of a first of each of said pluralities of serially connected MOS inverters are formed adjacent to each other in said large scale integrated circuit; and wherein said pair of circuits are serially connected.

* * * * *